(12) United States Patent
Kornovich

(10) Patent No.: US 9,784,293 B2
(45) Date of Patent: Oct. 10, 2017

(54) UTILITY POLE MOUNTED SOLAR PANELS AND SECURING BRACKETS

(71) Applicant: Lonnie L. Kornovich, Clear Lake, MN (US)

(72) Inventor: Lonnie L. Kornovich, Clear Lake, MN (US)

( * ) Notice: Subject to any disclaimer, the term of this patent is extended or adjusted under 35 U.S.C. 154(b) by 526 days.

(21) Appl. No.: 14/446,003

(22) Filed: Jul. 29, 2014

(65) Prior Publication Data

US 2016/0036224 A1 Feb. 4, 2016

(51) Int. Cl.
| | |
|---|---|
| *H02J 1/10* | (2006.01) |
| *H02J 3/38* | (2006.01) |
| *H02J 7/34* | (2006.01) |
| *F16B 2/06* | (2006.01) |
| *H01L 31/0749* | (2012.01) |
| *H02S 40/32* | (2014.01) |
| *H02S 20/20* | (2014.01) |

(52) U.S. Cl.
CPC .......... *F16B 2/065* (2013.01); *H01L 31/0749* (2013.01); *H02S 20/20* (2014.12); *H02S 40/32* (2014.12); *Y02E 10/541* (2013.01)

(58) Field of Classification Search
CPC .......... H02J 3/382; H02S 20/20; H02S 40/32; F16B 2/065
USPC ........................................................ 307/18
See application file for complete search history.

(56) References Cited

U.S. PATENT DOCUMENTS

| | | | |
|---|---|---|---|
| 4,200,904 A | 4/1980 | Doan | |
| 4,281,369 A | 7/1981 | Batte | |
| 4,319,310 A | 3/1982 | Kingsley | |
| 5,149,188 A | 9/1992 | Robbins | |
| 5,155,668 A | 10/1992 | Tanner et al. | |
| 5,426,577 A * | 6/1995 | Gordin | ............... E04H 12/24 174/45 R |

(Continued)

FOREIGN PATENT DOCUMENTS

WO WO 2016/018952 A1 2/2016

OTHER PUBLICATIONS

"Vertex Worm Drive Hose Clamps", Jul. 29, 2014, HTTP;//www.vertexdistribution.com/products/hose-clamps/, vertexdistribution, 5 pages.

(Continued)

*Primary Examiner* — Carlos Amaya
(74) *Attorney, Agent, or Firm* — Albert W. Watkins

(57) ABSTRACT

An electrical transmission system has solar electrical generation stations mounted directly to existing utility poles along a transmission line. Solar panels and securing brackets define each solar electric generation station. Each station has at least one generally East facing panel, at least one generally South facing panel, and at least one generally West facing panel. A power coupling conducts electricity generated by the solar electric generation station into the transmission lines. In one embodiment, a plurality of spacer members support the separate and distinct solar collector surfaces in a fixed position relative to the utility pole and have a plurality of clamp passages. A plurality of clamps pass through the clamp passages to guide and retain the clamps. In another embodiment, a plurality of adjustable brackets affix with the spacer members adjacent a first end and to the utility pole adjacent a second end distal to the first end.

18 Claims, 3 Drawing Sheets

(56) References Cited

U.S. PATENT DOCUMENTS

| | | | |
|---|---|---|---|
| 6,060,658 A | 5/2000 | Yoshida et al. | |
| 7,424,992 B1 * | 9/2008 | Dziedzic | E04H 12/20 248/218.4 |
| 7,976,180 B1 | 7/2011 | Haun et al. | |
| 7,980,725 B2 | 7/2011 | Yu et al. | |
| 7,988,320 B2 | 8/2011 | Brumels | |
| 7,997,754 B2 | 8/2011 | Zhang et al. | |
| 8,007,124 B2 | 8/2011 | Kim | |
| 8,029,154 B2 | 10/2011 | Myer | |
| 8,097,980 B2 | 1/2012 | Cyrus et al. | |
| 8,106,593 B2 | 1/2012 | Nevins | |
| 8,215,807 B1 | 7/2012 | Brunesti | |
| 8,246,207 B2 | 8/2012 | Chen et al. | |
| 8,267,541 B2 | 9/2012 | Watanabe et al. | |
| 8,313,210 B2 | 11/2012 | Zheng | |
| 8,342,706 B2 | 1/2013 | Zheng | |
| 8,466,581 B2 | 6/2013 | Kuran | |
| 2005/0056743 A1 * | 3/2005 | Ware | F16L 3/137 248/218.4 |
| 2008/0137327 A1 | 6/2008 | Hodulik | |
| 2008/0289153 A1 | 11/2008 | Bowater et al. | |
| 2010/0071684 A1 | 3/2010 | Cowan et al. | |
| 2010/0327657 A1 | 12/2010 | Kuran | |
| 2012/0174478 A1 | 7/2012 | Chen et al. | |
| 2012/0211046 A1 | 8/2012 | Smyth et al. | |
| 2012/0280570 A1 * | 11/2012 | Smythe | H02G 7/00 307/69 |
| 2013/0118555 A1 | 5/2013 | Samuels | |
| 2013/0234605 A1 | 9/2013 | Burrows | |
| 2013/0276883 A1 | 10/2013 | Belaidi et al. | |
| 2013/0322063 A1 | 12/2013 | Tittle | |
| 2014/0015324 A1 | 1/2014 | Brennan et al. | |

OTHER PUBLICATIONS

"Screw Based Strapping Products", Jul. 29, 2014, HTTP;//www.signsdirect.com/Home/Band-Strap-Brackets_2/, signsdirect, 2 pages.

"Stainless Steel Quick Release Clamps", Jul. 29, 2014, HTTP;//www.steel-banding.com/products/stainless-quick-release-clamps.html, MOWCO Industry Ltd., 3 pgs.

* cited by examiner

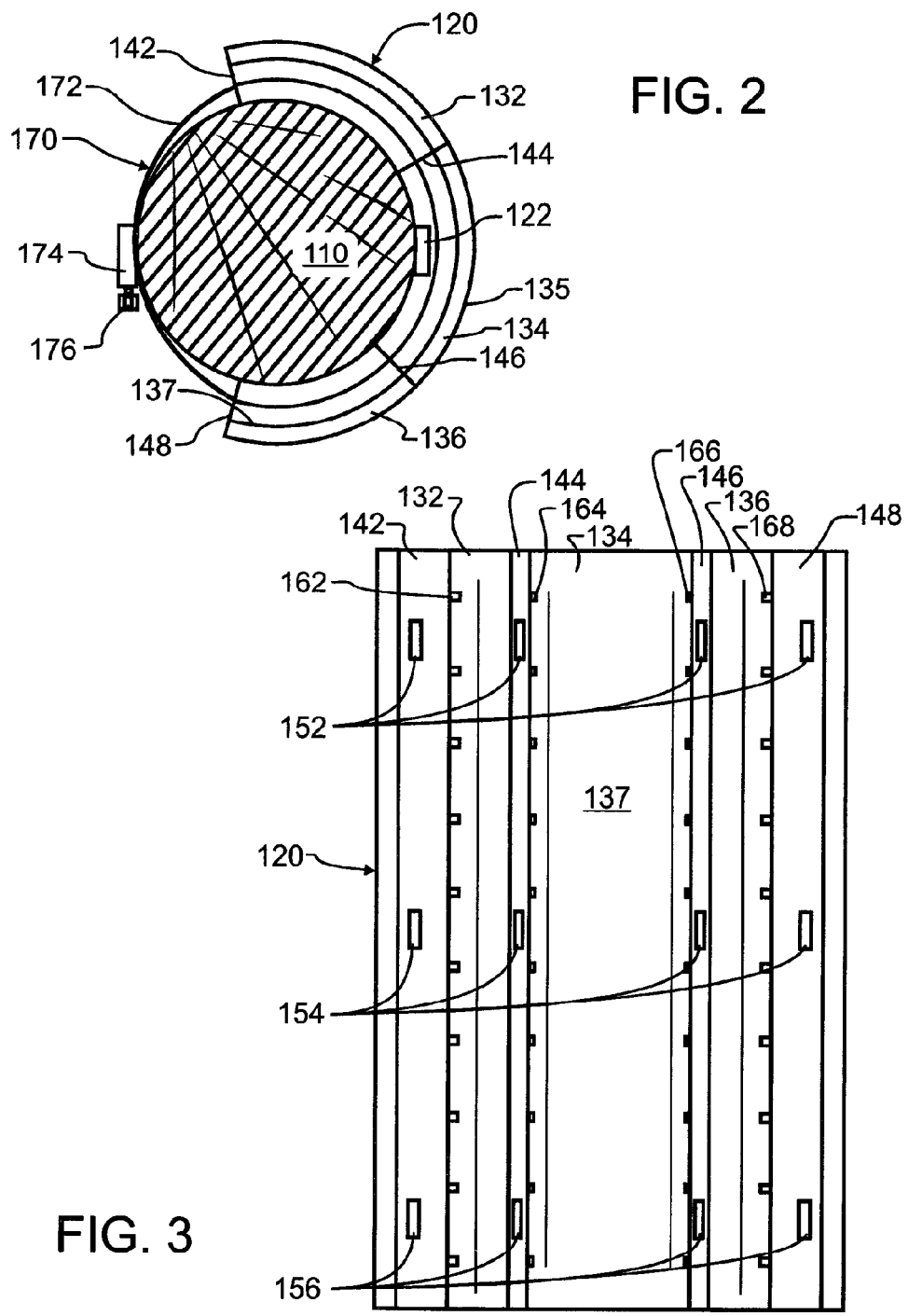

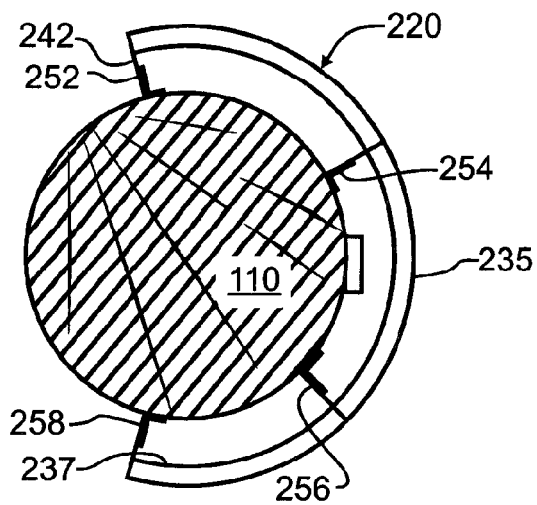
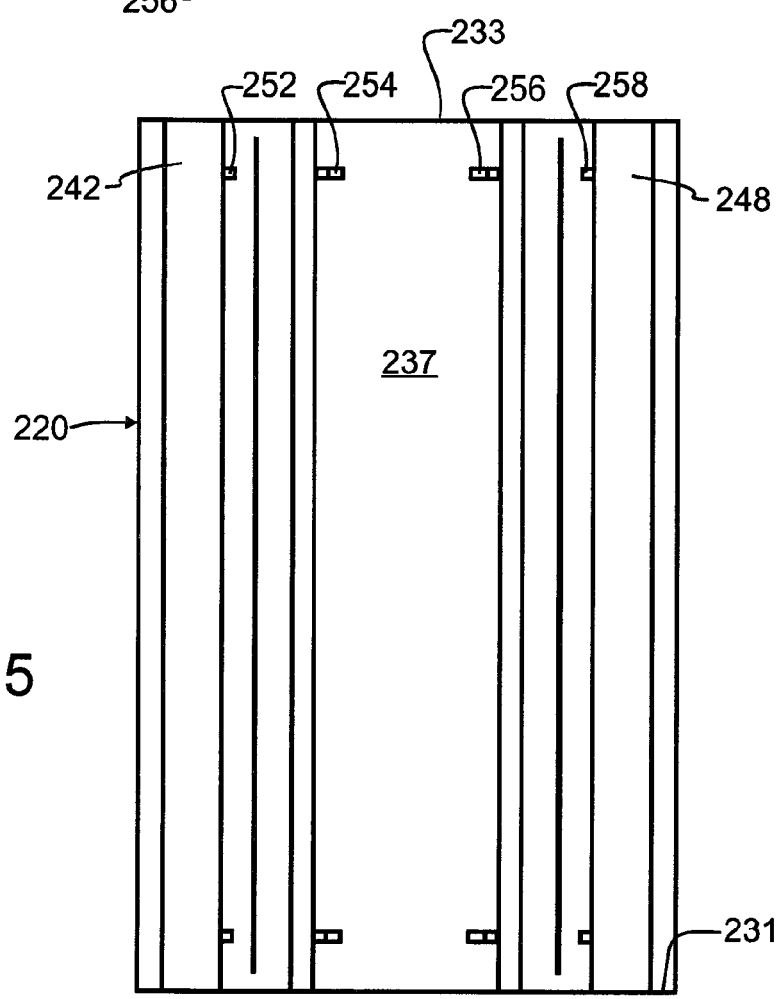
FIG. 4
FIG. 5

UTILITY POLE MOUNTED SOLAR PANELS AND SECURING BRACKETS

BACKGROUND OF THE INVENTION

1. Field of the Invention

This invention pertains generally to electrical transmission or interconnection systems, and more particularly to such systems having plural supply circuits or sources distributed along a load circuit. In a most preferred manifestation, the present invention provides solar panels and securing brackets that may, for exemplary purposes, be mounted directly to utility poles including but not limited to power line supporting poles and light poles.

2. Description of the Related Art

Conventional electrical power generation is achieved using extremely large generating facilities that might burn coal or oil, or through nuclear reaction produce heat. The heat is then used to convert water to steam, and the steam used to spin a turbine. Next, the electricity is transmitted over great distance from this large central plant to the end user. In the transmission and distribution of electrical energy, there are many utility poles that are anchored into the earth, and power lines strung overhead between adjacent utility poles. In view of the essential nature that electricity plays in the modern world, these utility poles are afforded right-of-way to allow the utility companies to access and maintain the lines.

The efficiency of modern photovoltaic cells is very high, and the cost is quite low. Furthermore, the electricity may be generated at or close to the point of consumption, which may provide lower losses and greater distribution capacity. Consequently, much opportunity exists to generate a substantial portion of electricity required for everyday use through the generation of electricity using sunlight, referred to in technical circles as solar insolation. Unfortunately, there has always been a divide between the capability to produce power from sunlight and the desire to actually install a system.

There have been several barriers to the adoption of photovoltaic systems. One barrier is the cost of installation. Not only do the solar cells need to be purchased, but they must also be installed in a manner that allows them to withstand the vagaries of the environment. Typically this includes wind and ice loading. Even when properly designed, the solar panels may become detached in an exceptional wind storm or hurricane, perpetrating damage to the building. Furthermore, when the solar cells are mounted to an existing building, the very act of installation can and often does harm the building. For example, a roof-mounted system will have fasteners that penetrate the roof of the structure. Over time, these "holes" in the roof may develop leaks that cause far more damage than the system will return in power savings. Consequently, the installation systems are necessarily expensive, and require expertise that in turn translates into high labor costs.

Yet another barrier has been the adverse alteration to the aesthetic appearance of a building. The panels are very difficult to incorporate into the appearance of a building, often detracting therefrom. A homeowner or commercial property owner will often forego the installation purely due to aesthetic factors.

However, the utility pole may also be used to support solar cell arrays. In this case, the photovoltaic array does not detract from the appearance of the pole and transmission line, and the utility pole is already securely anchored into the earth. U.S. Pat. No. 8,466,581 by Kuran, also published as 2010/0327657 and entitled "System and method for utility pole distributed solar power generation," the teachings and contents which are incorporated herein by reference, shows multiple poles with the one or more PV cells mounted on them, and provides an extensive discussion of the interface between the solar panels and the grid. Unfortunately, the Kuran construction is very exposed, leaving the system vulnerable to wind and ice loading. Furthermore, the panels are oriented for peak power production at or around midday, and so will only produce power for a few hours each day.

In U.S. Pat. No. 8,097,980 by Cyrus et al, entitled "Distributed solar power plant and a method of its connection to the existing power grid," the teachings and contents which are incorporated herein by reference, another PV system using utility poles is illustrated This patent fails to describe how the panels are mounted.

Several additional US patents and published applications illustrate solar cells coupled with poles, the teachings and contents which are incorporated herein by reference, including 2013/0322063 by Tittle, entitled "Solar retrofit lighting system"; U.S. Pat. No. 8,029,154 by Myer, entitled "Solar-powered light pole and LED light fixture"; and U.S. Pat. No. 6,060,658 by Yoshida et al, entitled "Pole having solar cells".

Other US patents and published applications, the teachings and contents which are incorporated herein by reference, illustrate PV panels used to power a light on the pole or other somewhat less relevant concepts, but that nevertheless represent the state of the industry and provide a representation of the level of skill in the field: U.S. Pat. No. 4,200,904 by Doan, entitled "Solar powered street lighting system"; U.S. Pat. No. 4,281,369 by Batte, entitled "Method and apparatus for solar power lighting"; U.S. Pat. No. 4,319,310 by Kingsley, entitled "Solar signs"; U.S. Pat. No. 5,149,188 by Robbins, entitled "Solar powered exterior lighting system"; U.S. Pat. No. 5,155,668 by Tanner et al, entitled "Solar powered lamp utilizing cold cathode fluorescent illumination and method of facilitating same"; U.S. Pat. No. 7,976,180 by Haun et al, entitled "Solar powered rechargeable street light with tamper resistant networkable system"; U.S. Pat. No. 7,980,725 by Yu et al, entitled "Solar energy street lamp structure with air passageway"; U.S. Pat. No. 7,988,320 by Brumels, entitled "Lighting device having adjustable solar panel bracket"; U.S. Pat. No. 7,997,754 by Zhang et al, entitled "Solar component and devices containing the same"; U.S. Pat. No. 8,007,124 by Kim, entitled "Self-generating streetlight"; U.S. Pat. No. 8,097,980 by Cyrus et al, entitled "Distributed solar power plant and a method of its connection to the existing power grid"; U.S. Pat. No. 8,106,593 by Nevins, entitled "Hybrid lighting device"; U.S. Pat. No. 8,215,807 by Brunesti, entitled "Illuminating flagpole assembly"; U.S. Pat. No. 8,246,207 by Chen et al, entitled "LED solar traffic marking panel fitted with integrated dimming controller"; U.S. Pat. No. 8,267,541 by Watanabe et al, entitled "Outdoor illuminating device and illuminating method"; U.S. Pat. No. 8,313,210 by Zheng, entitled "Solar-powered LED indicator lamp"; U.S. Pat. No. 8,342,706 by Zheng, entitled "LED lamp"; 2008/0137327 by Hodulik, entitled "Grid-tied solar streetlighting"; 2013/0118555 by Samuels, entitled "Solar energy collectors and methods for capturing solar energy"; and 2013/0234605 by Burrows, entitled "Hybrid outdoor streetlamp assembly".

In addition to the foregoing patents, Webster's New Universal Unabridged Dictionary, Second Edition copyright 1983, is incorporated herein by reference in entirety for the definitions of words and terms used herein.

SUMMARY OF THE INVENTION

In a first manifestation, the invention is an electrical transmission system having plural electrical supply sources distributed along one or more load circuits carried by one or more transmission lines. A utility pole suspends transmission lines. At least one solar electric generation station supplies electrical energy and has at least three separate and distinct solar collector surfaces, defined by at least one generally East facing panel, at least one generally South facing panel, and at least one generally West facing panel. A plurality of spacer members support the at least three separate and distinct solar collector surfaces in a fixed position relative to the utility pole and have a plurality of clamp passages. A plurality of clamps are adapted to operatively pass through the plurality of clamp passages which are adapted to operatively guide and retain the plurality of clamps. A power coupling conducts electricity generated by the at least one solar electric generation station into the transmission lines.

In a second manifestation, the invention is an electrical transmission system having plural electrical supply sources distributed along one or more load circuits carried by one or more transmission lines. A utility pole suspends transmission lines. At least one solar electric generation station supplies electrical energy and has at least three separate and distinct solar collector surfaces, defined by at least one generally East facing panel, at least one generally South facing panel, and at least one generally West facing panel. A plurality of spacer members support the at least three separate and distinct solar collector surfaces in a fixed position relative to the utility pole. A plurality of adjustable brackets are adapted to operatively affix with the plurality of spacer members adjacent a first end and to the utility pole adjacent a second end distal to the first end. A power coupling conducts electricity generated by the at least one solar electric generation station into the transmission lines.

OBJECTS OF THE INVENTION

Exemplary embodiments of the present invention solve inadequacies of the prior art by providing solar panels and securing brackets that define solar electric generation stations. These solar electric generation stations mount to existing utility poles to define an electrical transmission system.

The present invention and the preferred and alternative embodiments have been developed with a number of objectives in mind. While not all of these objectives are found in every embodiment, these objectives nevertheless provide a sense of the general intent and the many possible benefits that are available from embodiments of the present invention.

A first object of the invention is to provide a solar electric generation station that may be directly attached to most existing utility poles, thereby using the existing utility pole as the main support and as immediate access to the electric power grid. A second object of the invention is to provide a solar electric generation station that is easily installed upon the utility pole. Another object of the present invention is to provide a solar electric generation station that does not require a tracking mount, and yet which is capable of producing electricity throughout the daylight hours. A further object of the invention is to reduce the capital outlay required for a solar electric generation station and avoid the need for special permitting by using existing utility poles as the main support. Yet another object of the present invention is to readily enable design variations to optimize solar incidence upon the solar electric generation station at various latitudes.

BRIEF DESCRIPTION OF THE DRAWINGS

The foregoing and other objects, advantages, and novel features of the present invention can be understood and appreciated by reference to the following detailed description of the invention, taken in conjunction with the accompanying drawings, in which:

FIG. 2 illustrates a preferred embodiment solar electric generation station used in the preferred embodiment electrical transmission system of FIG. 1, the present view of FIG. 2 taken along section line 2' to reveal a top plan view of an installed preferred embodiment solar electric generation station.

FIG. 3 illustrates a rear elevational view of the preferred embodiment solar electric generation station of FIG. 2, but removed from the utility pole and with the screw-based clamps removed therefrom.

FIG. 4 illustrates a first alternative embodiment solar electric generation station used in the preferred embodiment electrical transmission system of FIG. 1, the present view of FIG. 4 taken along section line 2' to reveal a top plan view of an installed first alternative embodiment solar electric generation station.

FIG. 5 illustrates a rear elevational view of the first alternative embodiment solar electric generation station of FIG. 4, but removed from the utility pole.

DESCRIPTION OF THE PREFERRED EMBODIMENT

Figure 1:
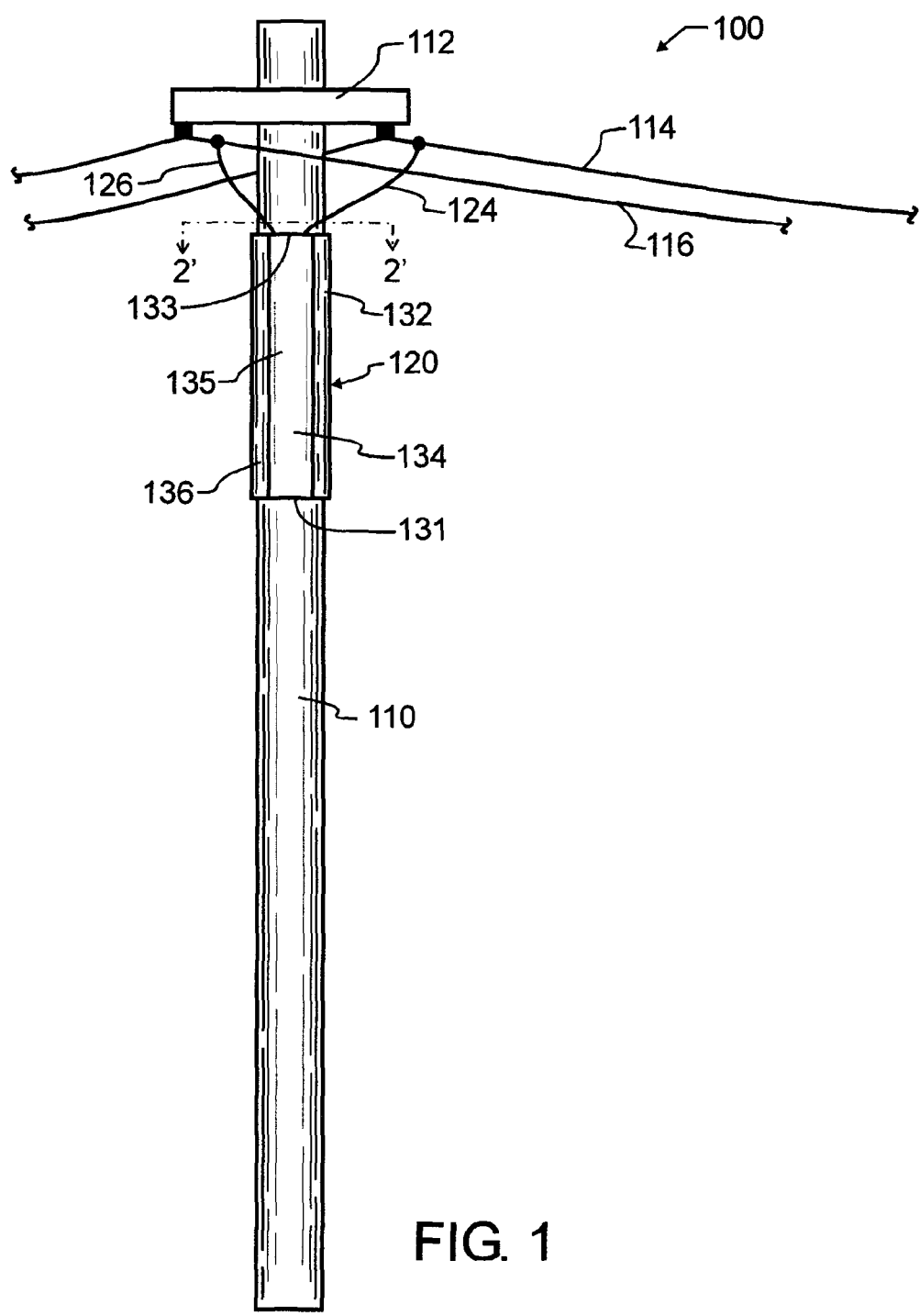
FIG. 1 illustrates a preferred embodiment electrical transmission system designed in accord with the teachings of the present invention from a front elevational view.

Manifested in the preferred embodiment illustrated in FIG. 1, the present invention provides an electrical transmission system 100 having plural electrical supply sources distributed along one or more load circuits such as carried by transmission lines 114, 116. A typical prior art utility pole 110 may, for exemplary purposes only and not solely limiting thereto be provided with a support arm 112 which suspends transmission lines 114, 116 from utility pole 110 and may provide electrical isolation.

The electrical supply sources are most preferably one or more solar electric generation stations 120. Each solar electric generation station 120 will preferably be provided with a Direct Current (DC) to Alternating Current (AC) inverter 122, which will preferably include various functions, such as the ability to synchronize with the power grid and the ability to disconnect therefrom in the event of a power failure such as a downed transmission line or other electrical transmission system 100 failure. These inverters are well known in the field of solar electric generation and widely commercially available, and further discussed in the patents incorporated herein by reference.

While a DC to AC inverter 122 is preferred, it will be understood that any suitable method of coupling electricity generated by solar electric generation station 120 into inverter output lines 124, 126 and from there to transmission lines 114, 116 will be understood to be incorporated herein. Consequently, inverter 122 might not perform and conversion from DC to AC, and may instead be a simple switch that allows solar electric generation station 120 to be disconnected from transmission lines 114, 116 in the event a repair is required within electrical transmission system 100, to protect the safety of a technician.

Preferred embodiment solar electric generation station 120 has three separate and distinct solar collector surfaces, defined by East facing panel 132, South facing panel 134, and West facing panel 136. These panels 132, 134, 136 may be curved, such as illustrated in FIG. 2, in which case they will either have photovoltaic cells deposited or otherwise formed thereon, or will have flexible photovoltaic panels affixed thereto. Alternatively, panels 132, 134, 136 may each be planar, and angularly offset from each other to face approximately East, South and West, respectively. While three panels are illustrated for exemplary purposes, it will be understood that more or fewer panels may be used, though three are illustrated.

By providing these three panels 132, 134, 136, solar electric generation station 120 does not require a tracking mount, and is still capable of producing electricity throughout the daylight hours. Several manufacturers are able to produce solar cells that are of sufficiently low cost that the benefit from a tracking mount in increased power output throughout a daily cycle is not sufficient to justify the added expense and maintenance of the tracking components. Solar electric generation station 120 additionally is defined by a bottom 131, a top 133, an exterior face 135, and an interior face 137. As may be appreciated, exterior face 135 will preferably have one or more solar cells either formed in place or mounted thereon. For exemplary purposes only, and not solely limiting the invention thereto, exterior face 135 may have a Copper Indium Gallium Selenide (CIGS) thin film material, which is easily deposited onto flexible substrates, wrapped or glued to the exterior face or may in another extreme have many small fixed flat glass panels or panes containing mono-crystalline photovoltaic cells angularly stepped about utility pole 110.

Preferred embodiment solar electric generation station 120 is illustrated in greater detail in FIGS. 2 and 3. Supporting the three panels 132, 134, 136 in a fixed position relative to utility pole 110 are a plurality of spacer members, such as spacer members 142, 144, 146, 148. The number and location of these spacer members 142, 144, 146, 148 is not critical to the present invention, and will be determined when a number of design factors are taken into consideration. For exemplary and non-limiting purposes, factors such as wind, ice and snow loading may be used to determine a maximum load that might be placed upon preferred embodiment solar electric generation station 120. Once the maximum load is determined, then the type of material, the thickness and geometry, and other such design computations may be made. Preferably, a plurality of screw-based clamp passages 152, 154, 156 are also provided which serve to guide and retain a plurality of screw-based clamps 170 that may for exemplary purposes include a perforated strap 172, fixed screw mount 174, and worm-drive screw 176. This type of screw-based clamp 170 is commercially referred to as metal banding with worm gear type adjustment screws, and is commonly sold as hose and pipe clamp and for other purposes by such vendors as Vertex Distribution of Attleboro, Massachusetts, Signs Direct of Bloomington, Ill., and MOWCO Industry Limited of Shenzen, China. While other types of clamps may be provided in association with preferred embodiment solar electric generation station 120, including but not limited to other types of strap, band, and even webbing, screw-based clamp 170 provides very rapid, secure, intuitive, familiar, and low-cost coupling to utility pole 110, which is preferred to decrease the cost of installation and maintenance.

For many installations, the clamping force generated by screw-based clamp 170 will be sufficient to adequately support solar electric generation station 120. However, and particularly for coupling with wooden utility poles, one or more gripping teeth 162, 164, 166, 168 may be provided that protrude from spacer members 142, 144, 146, 148. The specific geometry of these gripping teeth 162, 164, 166, 168 may be altered to suit the characteristics most desired by a designer, such as penetration depth, inter-tooth spacing, and so forth. Alternatively, gripping teeth 162, 164, 166, 168 may be an alternative material that provides increased adhesion to a particular surface, such as a rubber or similar elastomeric material having a relatively high co-efficient of friction. Such materials may be useful for coupling with a steel utility pole.

As may be appreciated, preferred embodiment solar electric generation station 120 will be designed to directly attached to most existing utility poles, thereby using the existing utility pole 110 as the main support and as immediate access to the electric power grid. This in turn means that there is minimal mounting hardware required, no special anchoring into the earth, and no special permitting required, since the present electrical transmission system 100 uses existing infrastructure. This in turn means that preferred embodiment electrical transmission system 100 may be produced, installed, and maintained for substantially less capital than required for prior art systems.

The materials used to fabricate preferred embodiment solar electric generation station 120 are not critical to the present invention. For exemplary purposes, a base material used to fabricate panels 132, 134, 136 may be galvanized steel. In such case, the steel may be stamped or otherwise formed to shape, though again the particular method of deriving the shape is not critical to the present invention. As already discussed herein above, photovoltaic cells may be formed upon or affixed to the exterior face 135.

FIGS. 4 and 5 illustrate a first alternative embodiment solar electric generation station 220. In this embodiment, rather than using screw-based clamps, a set of adjustable mounting brackets 252, 254, 256, 258 are used to terminate spacer members 242, 244, 246, 248. The adjustable mounting brackets 252, 254, 256, 258 may, for exemplary purposes only and not solely limiting thereto, comprise L-shaped brackets that bolt, screw or otherwise affix to spacer members 242, 244, 246, 248, and also bolt, screw or otherwise affix at a distal end to utility pole 110. This method of attachment is limited, since adjustable mounting brackets 252, 254, 256, 258 or adjacent to interior face 237 and therefore hard to access. Nevertheless, adjustable mounting brackets 252, 254, 256, 258 may be provided near to the top and bottom of solar electric generation station 220, and in such case sufficient access clearance will exist.

Alternative embodiments of apparatus designed in accord with the present invention have been illustrated in FIGS. 2-5. The embodiments are distinguished by the hundreds digit, and various components within each embodiment designated by the ones and tens digits. However, many of the components are alike or similar between embodiments, so numbering of the ones and tens digits have been maintained wherever possible, such that identical, like or similar functions may more readily be identified between the embodiments. If not otherwise expressed, those skilled in the art will readily recognize the similarities and understand that in many cases like numbered ones and tens digit components may be substituted from one embodiment to another in accord with the present teachings, except where such substitution would otherwise destroy operation of the embodiment. Consequently, those skilled in the art will readily determine the function and operation of many of the components illustrated herein without unnecessary additional description.

While the embodiments of FIGS. 2 and 4 each illustrate the spacing between utility pole 110 and exterior face 135, 235 as being equidistant at both bottom 131, 231 and top 133, 233, the present invention also contemplates changing the spacing to suit a particular application. The present invention may be readily modified to optimize solar incidence upon the solar electric generation station at various latitudes and for various times of day.

At sunrise and sunset, the solar rays are arriving in a nearly horizontal plane. In this case, the spacing between utility pole 110 and the exterior face 135 adjacent to top 133 and East facing panel 132 may be approximately equal to the spacing between utility pole 110 and the exterior face 135 adjacent to bottom 131 and East facing panel 132. This means that East facing panel 132 is oriented in an approximately vertical plane, which may be appropriate for morning and evening solar exposure. Consequently, West facing panel 136 may also be oriented in an approximately vertical plane. However, except at the most northern latitudes, at midday the solar rays will be traveling at some angle generally between horizontal and vertical, such as at between 33 and 66 degrees from horizontal. To better align South facing panel 134 with the approximately midday sun, and thereby improve the collection of midday solar radiation and solar electric generation, South facing panel 134 may also be tilted from vertical. While not illustrated, it will be apparent that the spacing between utility pole 110 and the exterior face 135 adjacent to top 133 and South facing panel 134 may be very different from the spacing between utility pole 110 and the exterior face 135 adjacent to bottom 131 and South facing panel 134. Similarly, if more than three panels are used to define solar electric generation station 120, the panels that are more south facing may also tilt more out of the vertical plane towards the horizontal plane than less south facing panels.

While the foregoing details what is felt to be the preferred embodiment of the invention, no material limitations to the scope of the claimed invention are intended. Further, features and design alternatives that would be obvious to one of ordinary skill in the art are considered to be incorporated herein. The scope of the invention is set forth and particularly described in the claims herein below.

I claim:

1. An electrical transmission system having plural electrical supply sources distributed along at least one transmission line and providing electrical power to at least one load circuit, comprising:
   a utility pole suspending said at least one transmission line;
   at least one solar electric generation station supplying electrical energy partially circumscribing said utility pole and having at least three separate and distinct solar collector surfaces, defined by at least one generally East facing panel, at least one generally South facing panel, and at least one generally West facing panel;
   a plurality of generally planar spacer members each of said generally planar spacer members extending generally radially from said utility pole and together affixed with and supporting said at least three separate and distinct solar collector surfaces in a fixed position relative to said utility pole, each of said generally planar spacer members having a plurality of clamp passages;
   a plurality of clamps adapted to operatively pass through said plurality of clamp passages which are adapted to operatively guide and retain said plurality of clamps; and
   a power coupling that conducts electricity generated by said at least one solar electric generation station into said transmission lines.

2. The electrical transmission system of claim 1, wherein said plurality of clamps further comprises a plurality of screw-based clamps.

3. The electrical transmission system of claim 2, wherein individual ones of said plurality of screw-based clamps further comprise a perforated strap; a fixed screw mount; and a worm-drive screw.

4. The electrical transmission system of claim 1, wherein each individual one of said plurality of spacer members further comprise at least one gripping tooth that protrudes from said spacer member.

5. The electrical transmission system of claim 4, wherein said at least one gripping tooth further comprises a utility pole surface penetrating point.

6. The electrical transmission system of claim 4, wherein said at least one gripping tooth further comprises a material that provides increased adhesion to said utility pole.

7. The electrical transmission system of claim 1, wherein said power coupling further comprises a Direct Current (DC) to Alternating Current (AC) inverter.

8. The electrical transmission system of claim 7, wherein said power coupling further comprises a disconnect switch that allows said solar electric generation station to be disconnected from said transmission lines.

9. The electrical transmission system of claim 1, wherein said at least one solar electric generation station extends longitudinally parallel to said utility pole.

10. The electrical transmission system of claim 9, wherein said at least one solar electric generation station is concentric about said utility pole.

11. The electrical transmission system of claim 10, wherein said at least one solar electric generation station has a base material formed from a galvanized steel sheet, said plurality of generally planar spacer members affixed to and extending radially interior from said base material.

12. The electrical transmission system of claim 11, wherein said base material circumscribes an arc about said utility pole of greater than 180 degrees.

13. An electrical transmission system having plural electrical supply sources distributed along at least one transmission line and providing electrical power to at least one load circuit, comprising:
   a utility pole suspending said at least one transmission line;
   at least one solar electric generation station supplying electrical energy partially circumscribing said utility pole and defining a bottom, a top, an exterior face, and an interior face and having at least three separate and distinct solar collector surfaces affixed to said exterior face, defined by at least one generally East facing panel, at least one generally South facing panel, and at least one generally West facing panel;
   a plurality of generally planar spacer members, each of said plurality of generally planar spacer members extending generally radially from said utility pole and angularly offset from each other, said plurality of generally planar spacer members together affixed with and supporting said at least three separate and distinct solar collector surfaces in a fixed position relative to said utility pole, said East facing panel oriented in an approximately vertical plane, and said West facing panel also be oriented in an approximately vertical plane, said South facing panel tilted from vertical, each of said generally planar spacer members having a plurality of perforate clamp passages;

a plurality of clamps adapted to operatively pass through said plurality of perforate clamp passages which are adapted to operatively guide and retain said plurality of clamps; and a power coupling that conducts electricity generated by said at least one solar electric generation station into said transmission lines.

14. The electrical transmission system of claim 13, wherein said at least three separate and distinct solar collector surfaces further comprise more than three panels used to define solar electric generation station, said panels that are more south facing also tilting more out of the vertical plane towards a horizontal plane than less south facing panels.

15. The electrical transmission system of claim 13, wherein said at least one solar electric generation station extends longitudinally generally parallel to said utility pole.

16. The electrical transmission system of claim 15, wherein said at least one solar electric generation station is concentric about said utility pole.

17. The electrical transmission system of claim 16, wherein said at least one solar electric generation station has a base material formed from a galvanized steel sheet, said plurality of generally planar spacer members affixed to and extending radially interior from said base material.

18. The electrical transmission system of claim 17, wherein said base material circumscribes an arc about said utility pole of greater than 180 degrees.

\* \* \* \* \*